(12) United States Patent
Miyachi et al.

(10) Patent No.: US 7,399,649 B2
(45) Date of Patent: Jul. 15, 2008

(54) SEMICONDUCTOR LIGHT-EMITTING DEVICE AND FABRICATION METHOD THEREOF

(75) Inventors: Mamoru Miyachi, Saitama (JP); Hiroyuki Ota, Saitama (JP); Yoshinori Kimura, Saitama (JP); Kiyofumi Chikuma, Saitama (JP)

(73) Assignee: Pioneer Corporation, Tokyo (JP)

( * ) Notice: Subject to any disclaimer, the term of this patent is extended or adjusted under 35 U.S.C. 154(b) by 87 days.

(21) Appl. No.: 10/577,722

(22) PCT Filed: Sep. 27, 2004

(86) PCT No.: PCT/JP2004/014087

§ 371 (c)(1),
(2), (4) Date: May 2, 2006

(87) PCT Pub. No.: WO2005/043633

PCT Pub. Date: May 12, 2005

(65) Prior Publication Data

US 2007/0059852 A1 Mar. 15, 2007

(30) Foreign Application Priority Data

Nov. 4, 2003 (JP) .............................. 2003-374609

(51) Int. Cl.
*H01L 21/00* (2006.01)
(52) U.S. Cl. .................. 438/22; 438/142; 438/584; 438/626; 438/631; 257/E21.001; 257/E21.206; 257/E21.243; 257/E21.303
(58) Field of Classification Search .................. 438/22
See application file for complete search history.

(56) References Cited

U.S. PATENT DOCUMENTS

| | | | |
|---|---|---|---|
| 6,495,862 B1 | 12/2002 | Okazaki et al. | |
| 2003/0013266 A1* | 1/2003 | Fukuda et al. | 438/400 |
| 2003/0062530 A1* | 4/2003 | Okazaki et al. | 257/79 |
| 2003/0218179 A1 | 11/2003 | Koide et al. | |
| 2004/0048409 A1 | 3/2004 | Biwa et al. | |
| 2004/0096999 A1* | 5/2004 | Lin et al. | 438/30 |
| 2005/0062125 A1* | 3/2005 | Kitaguchi | 257/492 |

FOREIGN PATENT DOCUMENTS

| | | | |
|---|---|---|---|
| JP | 4-354382 A | 12/1992 | |
| JP | 9-92878 A | 4/1997 | |

(Continued)

*Primary Examiner*—Walter Lindsay, Jr.
*Assistant Examiner*—Abdulfattah Mustapha
(74) *Attorney, Agent, or Firm*—Arent Fox LLP (57) ABSTRACT

An underlying layer ALY of GaN is formed on a sapphire substrate SSB; a transfer layer TLY of GaN with a bump and dip shaped surface is formed on the underlying layer ALY; a light absorption layer BLY is formed on the bump and dip shaped surface of the transfer layer TLY; and a grown layer 4 of a planarization layer CLY and a structured light-emitting layer DLY having at least an active layer are formed on the light absorption layer BLY. A support substrate 2 is provided on the grown layer 4. The backside of the sapphire substrate SSB is irradiated with light of the second harmonic of YAG laser (wavelength 532 nm) to decompose the light absorption layer BLY and delaminate the sapphire substrate SSB, thereby allowing the planarization layer CLY of a bump and dip shaped surface to be exposed as a light extraction face.

11 Claims, 7 Drawing Sheets

FOREIGN PATENT DOCUMENTS

| | | |
|---|---|---|
| JP | 10-41586 A | 2/1998 |
| JP | 11-168236 A | 6/1999 |
| JP | 2000-196152 A | 7/2000 |
| JP | 2000-299494 A | 10/2000 |
| JP | 2002-222773 A | 8/2002 |
| JP | 2003-69075 A | 3/2003 |
| JP | 2003-282942 A | 10/2003 |
| JP | 2003-318443 A | 11/2003 |

* cited by examiner

SEMICONDUCTOR LIGHT-EMITTING DEVICE AND FABRICATION METHOD THEREOF

CROSS-REFERENCE TO RELATED APPLICATION

This application is a National Stage entry of International Application No. PCT/JP2004/014087, filed Sep. 27, 2004, the entire specification claims and drawings of which are incorporated herewith by reference.

BACKGROUND OF THE INVENTION

The present invention relates to a semiconductor light-emitting device which is formed such as of nitride semiconductor, and to a fabrication method thereof.

In recent years, while green to blue light-emitting diodes (LEDs) formed of nitride semiconductor have been realized, shorter-wavelength LEDs are also under development for application to white LEDs.

Generally, in fabricating such a short-wavelength LED, an underlying layer of gallium nitride (GaN) is laminated on a sapphire substrate, and thereafter, nitride semiconductor crystal is grown on the underlying layer, thereby forming a grown layer having an active layer or the like. In order to form a grown layer having a good crystallinity, it is indispensable to form an underlying layer of GaN on the sapphire substrate.

However, since gallium nitride (GaN) absorbs light of wavelengths shorter than 360 nm, the underlying layer is removed from the grown layer to prevent light produced in the active layer of the grown layer from being absorbed by the underlying layer when the light is transmitted out of the device.

The gallium nitride layer to serve as the underlying layer may be removed by the following suggested techniques. That is, the sapphire substrate and the underlying layer may be removed from the grown layer by mechanical polishing. Alternatively, the sapphire substrate may be removed by laser lift-off, and thereafter, the underlying layer may be removed from the grown layer by etching or mechanical polishing.

On the other hand, commercially available blue LEDs of nitride semiconductor are designed to allow light produced in the active layer to be transmitted through a planar transparent electrode or a translucent electrode, which is provided as a drive current supply p-electrode on a light extraction face (p-type layer) of the grown layer, or alternatively to be transmitted through a planar sapphire substrate.

However, it is difficult to improve light extraction efficiency in the case of the structure in which light is transmitted through the planar transparent electrode or the translucent electrode provided as the p-electrode. This is because the refractive index of nitride semiconductor is about 2.5 and for example, ITO used as the transparent electrode also has a high refractive index, thus causing the majority of light produced in the active layer to be reflected on a planar semiconductor/resin interface.

It is also difficult to improve light extraction efficiency even in the case of the structure in which light is transmitted through the planar sapphire substrate. This is because the majority of light produced in the active layer is reflected on a semiconductor/sapphire/resin interface.

On the other hand, as a suggested technique to improve light extraction efficiency in this manner, GaP-based LEDs emitting red light is provided with a coarse-grained light extraction face by wet etching, so that the light produced in the active layer is reflected with difficulty on the coarse-grained light extraction face, thereby providing an improved light extraction efficiency (Japanese Patent Application Laid-Open No. 2000-299494 and Japanese Patent Application Laid-Open No. Hei 4-354382).

However, it is difficult to properly remove the entire underlying layer (gallium nitride layer) having a large area using the technique for removing the gallium nitride layer employed as the underlying layer from the grown layer only by mechanical polishing, or by laser lift-off and etching or mechanical polishing as mentioned above.

Since the nitride semiconductor is chemically stable and mechanically hard, it is also difficult to provide a coarse-grained light extraction face to the GaP-based LED by wet etching as disclosed in Japanese Patent Application Laid-Open No. 2000-299494 or Japanese Patent Application Laid-Open No. Hei 4-354382. Accordingly, the light extraction efficiency cannot be easily improved.

Additionally, in the case where light is extracted through the sapphire substrate in order to prevent light from being absorbed by the translucent electrode or transparent electrode, the light extraction efficiency cannot be improved by providing a coarse-grained surface because the sapphire substrate is more difficult to process than the nitride semiconductor.

The present invention was developed in view of the aforementioned conventional problems. It is therefore an object of the present invention to provide a fabrication method of a semiconductor light-emitting device having the underlying layer removed efficiently from the grown layer.

It is another object of the present invention to provide a fabrication method of a semiconductor light-emitting device which allows for improving light extraction efficiency.

It is still another object of the present invention to provide a fabrication method of a semiconductor light-emitting device which allows for efficiently removing the underlying layer from the grown layer and improving light extraction efficiency.

SUMMARY OF THE INVENTION

In order to achieve the aforementioned objects, according to a first aspect of the present invention, there is provided a fabrication method of a semiconductor light-emitting device which comprises: a first process for forming an underlying layer on a substrate; a second process for forming a mask having a number of microscopic opening portions on the underlying layer; a third process for forming a bump and dip shaped transfer layer having a number of projected portions made up of a plurality of microscopic planes inclined with respect to the substrate plane, by selective growth at each of the opening portions and by lateral growth on the mask; a fourth process for forming, on the bump and dip shaped transfer layer, a light absorption layer less in band gap energy than the underlying layer and the transfer layer; a fifth process for forming a planarization layer having a flat principal growth plane on the light absorption layer; a sixth process for forming a structured light-emitting layer having at least an active layer on the planarization layer; and a seventh process for decomposing the light absorption layer by irradiating the backside of the substrate with light reaching the light absorption layer to delaminate the substrate, the underlying layer, and the transfer layer from the planarization layer. The method is also characterized in that the planarization layer is employed as a light extraction face for extracting light produced in the active layer out of the device.

According to a second aspect of the present invention, there is provided a fabrication method of a semiconductor light-emitting device based on the first aspect which is characterized in that the planarization layer is formed of n-type nitride semiconductor in the fifth process, and in the sixth process, the structured light-emitting layer is formed of a multi-layered structure starting with n-type nitride semiconductor from the planarization layer side and ending with p-type nitride semiconductor.

According to a third aspect of the present invention, there is provided a fabrication method of a semiconductor light-emitting device based on the first aspect which is characterized in that the underlying layer, the transfer layer, the light absorption layer, the planarization layer, and the structured light-emitting layer are formed of nitride-based III-V compound semiconductor with a group-V element of nitrogen (N).

According to a fourth aspect of the present invention, there is provided a fabrication method of a semiconductor light-emitting device based on the first aspect which is characterized in that the light absorption layer is of InGaN.

According to a fifth aspect of the present invention, there is provided a fabrication method of a semiconductor light-emitting device based on the first aspect which is characterized in that the substrate is formed of any one of sapphire, GaN, AlN, and SiC having a {0001} plane as a principal plane.

According to a sixth aspect of the present invention, there is provided a fabrication method of a semiconductor light-emitting device based on the first aspect which is characterized in that the opening portions of the mask are formed in the second process so that closest opening portions are located in a <1-100> orientation of the underlying layer and all opening portion centers are a 6-fold rotational symmetry center.

According to a seventh aspect of the present invention, there is provided a fabrication method of a semiconductor light-emitting device based on the first aspect which is characterized in that in the second process, the opening portions of the mask are formed in a striped shape in parallel to a crystalline axis <1-100> or <11-20> of the underlying layer.

According to an eighth aspect of the present invention, there is provided a fabrication method of a semiconductor light-emitting device based on the first aspect which is characterized in that the light absorption layer is of semiconductor containing an impurity to serve as a non-radiative recombination center or of indirect transition type semiconductor.

According to a ninth aspect of the present invention, there is provided a fabrication method of a semiconductor light-emitting device based on the first aspect which is characterized in that in the seventh process, an energy level of the light used to irradiate the backside of the substrate is less than a band gap energy level of the underlying layer and the transfer layer and is greater than a band gap energy level of the light absorption layer.

According to a tenth aspect of the present invention, there is provided a fabrication method of a semiconductor light-emitting device based on the first aspect which is characterized in that in the seventh process, the light used to irradiate the backside of the substrate has a wavelength of 360 nm or more.

BRIEF DESCRIPTION OF THE DRAWINGS

These and other objects and advantageous of the present invention will become clearly understood from the following description with reference to the accompanying drawings, wherein.

DETAILED DESCRIPTION OF THE PREFERRED EMBODIMENTS

Now, the best mode for carrying out the present invention will be described with reference to FIGS. 1(a)-1(e).

Figure 1:
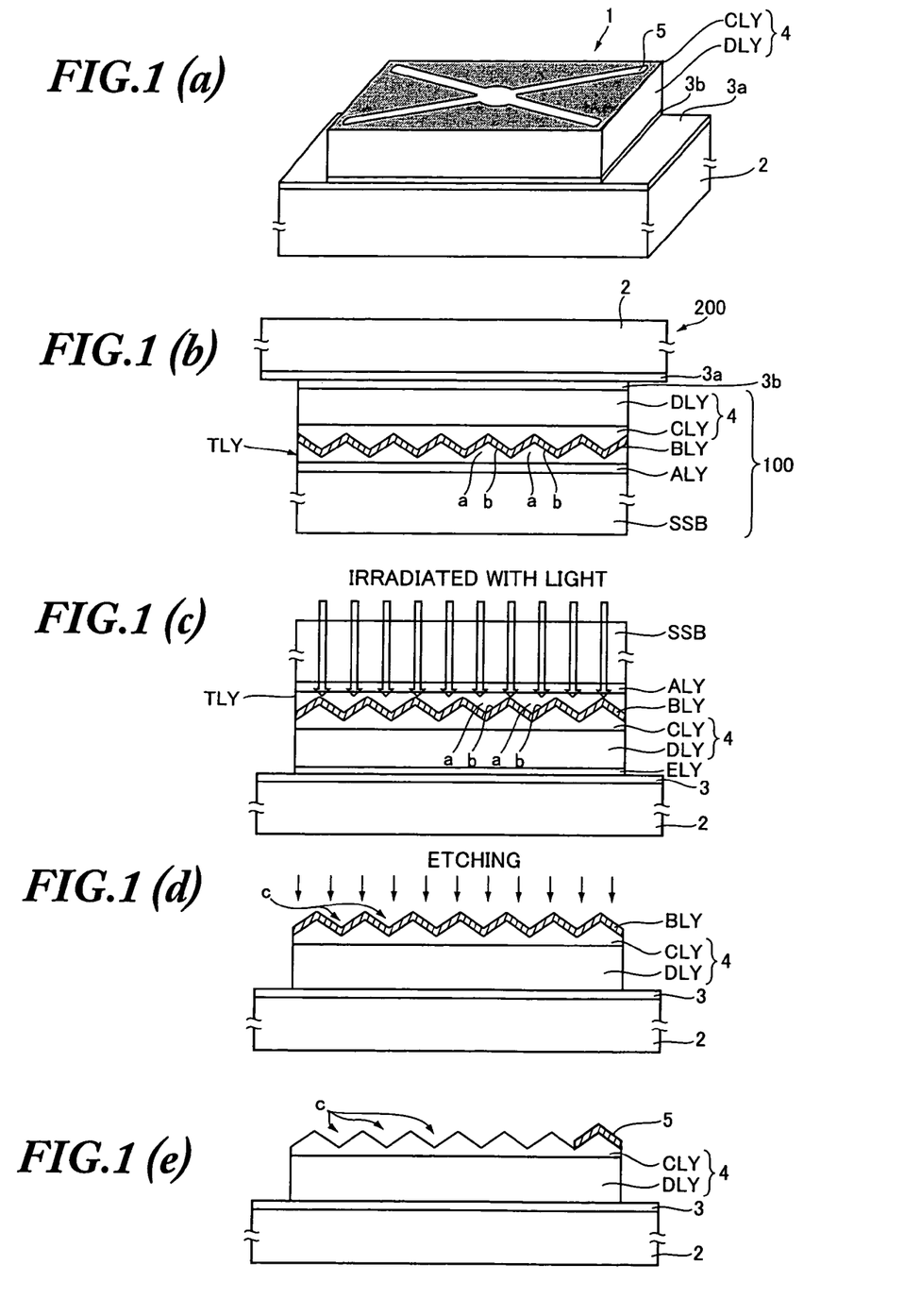
FIGS. 1(a)-1(e) are views showing a structure and a fabrication method of a semiconductor light-emitting device as the best mode for carrying out the present invention.
Figure 2:
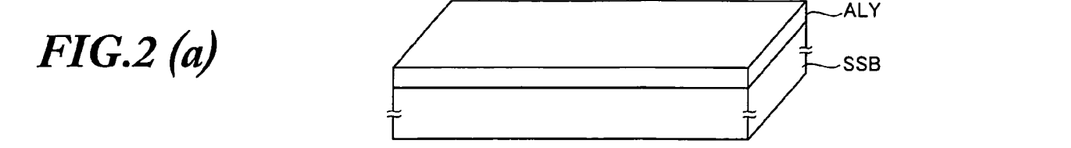
FIGS. 2(a)-2(e) are views showing a fabrication method of a semiconductor light-emitting device according to a first example.
Figure 3:
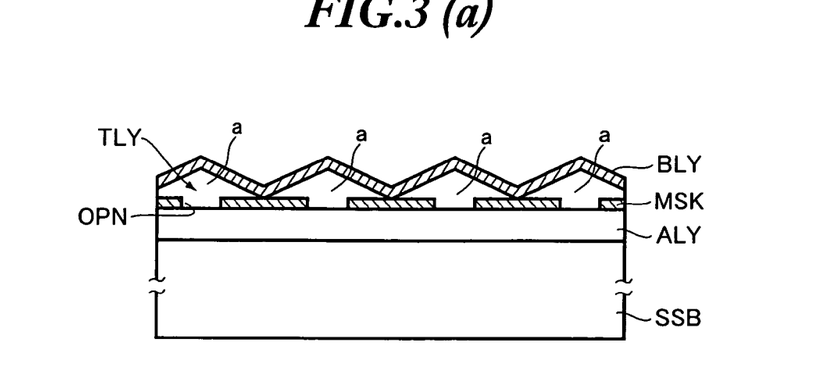
FIGS. 3(a)-3(c) are views showing the fabrication method of the semiconductor light-emitting device according to the first example, following the fabrication method shown in FIGS. 2(a)-2(e)
Figure 4:
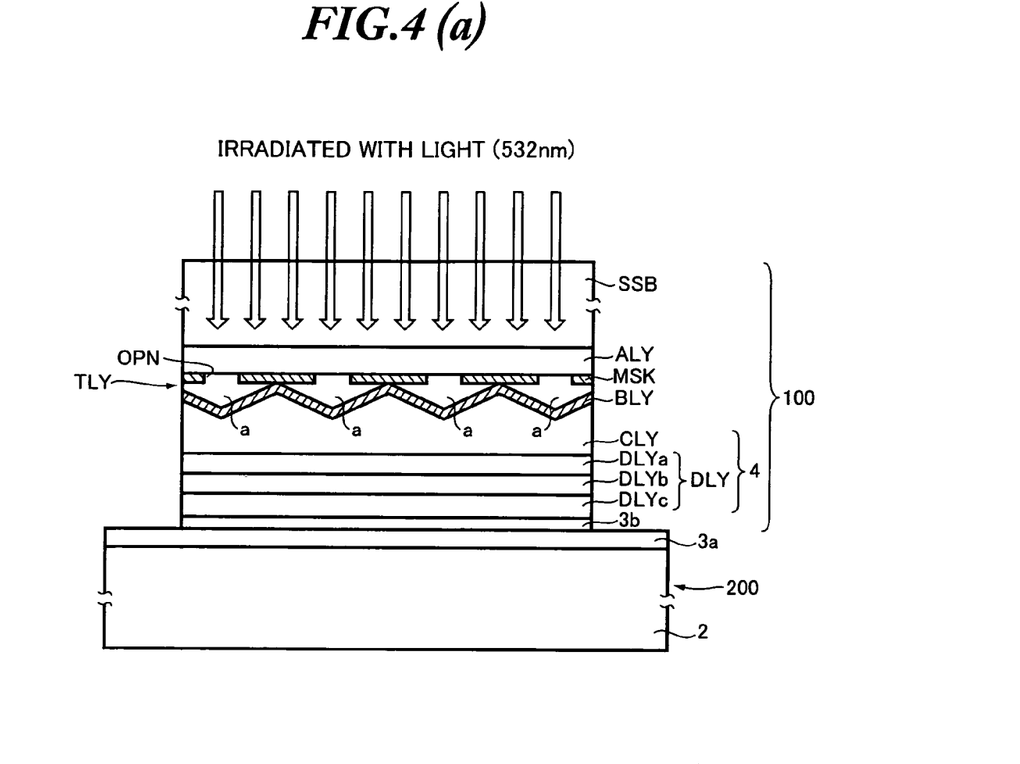
FIGS. 4(a), 4(b) are views showing the fabrication method of the semiconductor light-emitting device according to the first example, following the fabrication method shown in FIGS. 3(a)-3(c)
Figure 5:
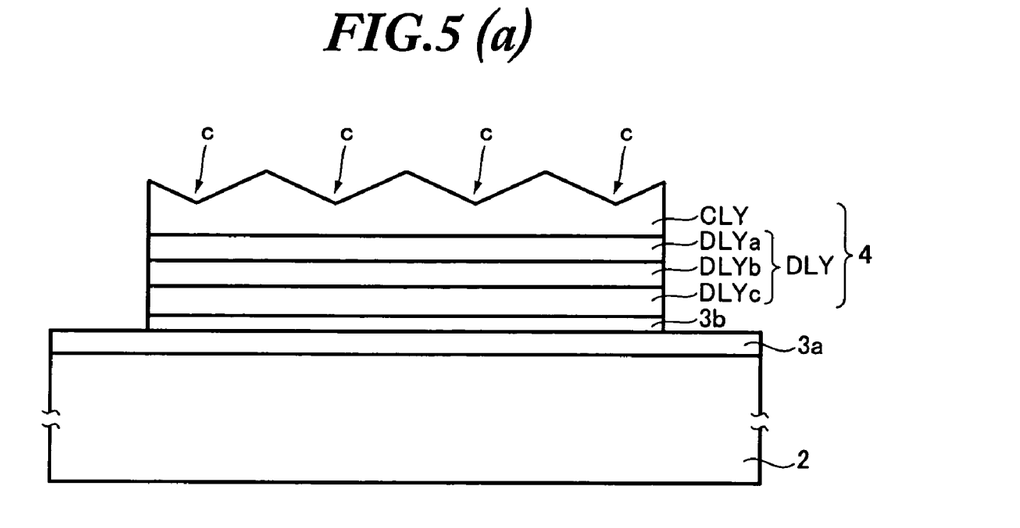
FIGS. 5(a), 5(b) are views showing the fabrication method of the semiconductor light-emitting device according to the first example, following the fabrication method shown in FIGS. 4(a), 4(b)

FIG. 1(a) is a schematic perspective view showing the structure of a semiconductor light-emitting device, and FIGS. 1(b) to 1(e) are schematic longitudinal sectional views showing a fabrication method of the semiconductor light-emitting device.

In FIG. 1(a), the semiconductor light-emitting device 1 includes a support substrate 2 with an electrode layer 3a formed on the surface, and a grown layer 4 with an electrode layer 5 formed on the surface and an ohmic electrode layer 3b formed on the backside. The grown layer 4 is integrally securely adhered onto the surface of the support substrate 2 via the electrode layer 3a and the ohmic electrode layer 3b which are adhered to each other by fusion or the like.

The grown layer 4 has a multi-layered structure in which a structured light-emitting layer DLY having a contact layer, a cladding layer, and an active layer, and a planarization layer CLY to serve as a light extraction face are laminated. The structured light-emitting layer DLY and the planarization layer CLY are formed by laminating nitride-based III-V compound semiconductor with a group-V element of nitrogen (N).

The surface of the planarization layer CLY is constructed such that a number of microscopic concave portions are formed in high density. More specifically, a number of microscopic concave portions of an inverted hexagonal pyramid shape are formed in high density on the entire surface. Moreover, for example, the electrode layer 5 having the shape of a cross connecting between the opposite corners of the planarization layer CLY is formed on part of the surface thereof that is bump and dip shaped by the aforementioned concave portions.

In the semiconductor light-emitting device 1 having such a structure, when a drive current is externally supplied between the electrode layer 3a in contact with the ohmic electrode layer 3b and the electrode layer 5 provided on the planarization layer CLY, the drive current passes through the planarization layer CLY and flows into the active layer in the structured light-emitting layer DLY, allowing short-wavelength light to be produced from the active layer. Then, the short-wavelength light produced from the active layer is transmitted out of the device through the bump and dip shaped surface of the planarization layer CLY. That is, the semiconductor light-emitting device 1 has a surface emission type device structure.

Now, a fabrication method of the semiconductor light-emitting device 1 will be described with reference to FIGS. 1(b) to 1(e).

To begin with, in the process shown in FIG. 1(b), an underlying layer ALY of gallium nitride (GaN) is laminated by MOCVD or the like on a substrate SSB formed of any material of sapphire, GaN, AlN, and SiC. Then, a transfer layer TLY of gallium nitride (GaN) having a number of microscopic bump and dip portions is formed. More specifically, a number of microscopic projected portions "a" of a hexagonal pyramid shape (preferably, a regular hexagonal pyramid) having an inclined plane "b" are formed in the surface direction in high density, thereby forming the transfer layer TLY of gallium nitride (GaN) having a bump and dip shaped surface on the underlying layer ALY.

Furthermore, $In_xGa_{1-x}N$ (where x>0.5) containing an impurity to serve as a non-radiative recombination center or an indirect transition type semiconductor less in energy gap than the underlying layer ALY and the transfer layer TLY is deposited by MOCVD or the like on the bump and dip shaped surface of the transfer layer TLY, thereby forming a light absorption layer BLY which is bump and dip shaped to the surface shape of the transfer layer TLY.

Subsequently, the aforementioned grown layer 4 including the planarization layer CLY and the structured light-emitting layer DLY is formed on the surface of the light absorption layer BLY. That is, the planarization layer CLY of nitride-based III-V compound semiconductor (specifically, n-type AlGaN) is laminated on the surface of the light absorption layer BLY, and thereafter, nitride-based III-V compound semiconductor crystal of a predetermined composition is grown on the flat surface of the planarization layer CLY. Thus, the structured light-emitting layer DLY having the active layer, the cladding layer, and the contact layer is laminated in a multi-layered structure.

To laminate the structured light-emitting layer DLY, the lamination is started with the n-type planarization layer CLY and ended up with the p-type contact layer, thereby forming each layer of the structured light-emitting layer DLY.

Then, the ohmic electrode layer 3b is formed on the entire surface of the structured light-emitting layer DLY, thus allowing an intermediate 100 to be fabricated which has the underlying layer ALY, the transfer layer TLY, the light absorption layer BLY, the planarization layer CLY, the structured light-emitting layer DLY, and the ohmic electrode layer 3b on the substrate SSB.

On the other hand, separately from the aforementioned intermediate 100, an intermediate 200 is fabricated in which the electrode layer 3a for drive current supply is formed on the entire surface of the support substrate 2. Then, the electrode layer 3a of the intermediate 200 and the ohmic electrode layer 3b of the intermediate 100 are adhered to each other by fusion or the like, thereby allowing the intermediates 100 and 200 to be securely adhered integrally to each other as shown in FIG. 1(b).

Then, in the process shown in FIG. 1(c), the backside of the substrate SSB is irradiated towards the light absorption layer BLY with light at an energy level which is less than a band gap energy level of each of the underlying layer ALY and the transfer layer TLY and greater than a band gap energy level of the light absorption layer BLY. For example, with a sapphire substrate employed as the substrate SSB and the light absorption layer BLY formed of $In_{0.5}Ga_{0.5}N$, the backside of the substrate SSB is irradiated with laser light of the second harmonic of YAG laser (wavelength 532 nm) or the like.

When irradiated with the light at such an energy level, the substrate SSB, the underlying layer ALY, and the transfer layer TLY allow the light to pass therethrough. Then, the light is absorbed and converted into heat in the light absorption layer BLY, causing the heat to decompose the light absorption layer BLY into a gas. The light absorption layer BLY comprised of semiconductor containing a non-radiative recombination center or composed of an indirect transition type semiconductor is preferably allow the absorbed heat to be more quickly converted into heat.

Then, by delaminating the substrate SSB, the underlying layer ALY and the transfer layer TLY are delaminated at the gasified portion of the light absorption layer BLY along with the substrate SSB, thereby allowing the planarization layer CLY to be exposed.

Then, in the process shown in FIG. 1(d), a residue of the light absorption layer BLY which remains on the planarization layer CLY is removed by etching, thereby allowing the surface of the planarization layer CLY to be exposed.

Here, the interface between the light absorption layer BLY and the planarization layer CLY is bump and dip shaped by the aforementioned multiple microscopic projected portions "a" of a hexagonal pyramid shape. Accordingly, the exposed surface of the planarization layer CLY is formed in an inverted shape with respect to the aforementioned multiple microscopic projected portions "a" of a hexagonal pyramid shape, that is, in the bump and dip shape having a number of microscopic concave portions "c" of an inverted hexagonal pyramid shape.

Then, in the process shown in FIG. 1(e), the electrode layer 5 for supplying drive current is laminated on part of the bump and dip shaped surface of the planarization layer CLY, thereby completing the semiconductor light-emitting device 1. For example, as shown in FIG. 1(a), the electrode layer 5 is laminated to have the shape of a cross connecting between the opposite corners of the surface of the planarization layer CLY employed as a light extraction face, thus completing the semiconductor light-emitting device 1.

For convenient purposes, the explanation was given to the typical process for fabricating one semiconductor light-emitting device 1. However, practically in the first to third fabrication processes described with reference to FIGS. 1(b) to 1(e), the processing for fabricating a plurality of semiconductor light-emitting devices 1 on the substrate (sapphire substrate) SSB is collectively performed, and thereafter, the support substrate 2 is scribed on the backside to be divided into chips of a predetermined size, thereby forming a plurality of semiconductor light-emitting devices 1 in a collective manner.

As such, according to the semiconductor light-emitting device 1 having such a structure, the surface of the planarization layer CLY to serve as a light extraction face is not flat but bump and dip shaped with a number of microscopic concave portions "c" of an inverted hexagonal pyramid formed in high density. Accordingly, the ratio of the light produced in the active layer of the structured light-emitting layer DLY and reflected off the surface back into the device can be reduced, thereby making it possible to accomplish an improved light extraction efficiency.

Additionally, as shown in FIG. 1(a), the semiconductor light-emitting device 1 is constructed such that the planarization layer CLY formed of n-type nitride-based III-V compound semiconductor (specifically, n-type AlGaN) is employed as a light extraction face. Accordingly, even when a drive current is supplied to the electrode layer 5 with the electrode layer 5 formed only on part of the planarization layer CLY, the drive current flows through the generally entire planarization layer CLY into the generally entire region of the active layer in the structured light-emitting layer DLY. Accordingly, light is produced in the generally entire region of the active layer, and the produced light is allowed to transmit out of the device from the generally entire region of the planarization layer CLY (the entire region of the light extraction face), thereby making it possible to provide an improved light extraction efficiency.

That is, the n-type nitride-based III-V compound semiconductor has a specific resistance as low as about $10^{-3}$ Ωcm, which is extremely lower than the specific resistance of the p-type nitride semiconductor. Accordingly, when a drive current is supplied to the electrode layer 5 formed on part of the low specific resistance planarization layer CLY of n-type nitride-based III-V compound semiconductor (specifically, n-type AlGaN), the drive current not only flows through the part of the planarization layer CLY located immediately below the electrode layer 5 but also flows through the generally entire planarization layer CLY into the generally entire region of the active layer. Accordingly, light is produced in the generally entire region of the active layer, and the produced light is allowed to transmit out of the device from the generally entire region of the planarization layer CLY (the entire region of the light extraction face), thereby providing an improved light extraction efficiency.

In this regard, in the conventional GaN-based LED with the light extraction face formed of p-type nitride semiconductor, the p-type nitride semiconductor has a high resistance. Thus, as an effective technique for improving the injection diffusion efficiency of drive current into the active layer, it has been commonly practiced to form a thin metal translucent electrode or a transparent electrode such as of ITO on the generally entire surface of the light extraction face. However, according to the semiconductor light-emitting device 1, it is possible to form the electrode layer 5 by selecting shapes or materials without sticking to such a conventional technique, thereby providing an effect of improved design flexibility.

Additionally, according to the fabrication method of this embodiment, it is possible to readily use n-type nitride-based III-V compound semiconductor to form the planarization layer CLY which is to serve as a light extraction face.

That is, as was described with reference to FIG. 1(b), the planarization layer CLY of n-type nitride-based III-V compound semiconductor (specifically, n-type AlGaN) is formed on top of the light absorption layer BLY which has been previously formed on the substrate SSB, and then the structured light-emitting layer DLY is formed. Accordingly, only by delaminating the substrate SSB to remove the light absorption layer BLY as shown in FIGS. 1(c) and 1(d), the planarization layer CLY can be easily exposed and employed as a light extraction face. As a result, it is possible to provide improved mass productivity as well as to provide the aforementioned effects of improving light extraction efficiency and design flexibility.

It has also been attempted to form the surface of the planarization layer CLY into a bump and dip shape by a method different from the fabrication method of this embodiment, but resulting in a problem of reduced yields. Thus, the superiority of the fabrication method of this embodiment has been verified.

The attempt was made to the following fabrication method. That is, the transfer layer TLY and the light absorption layer BLY shown in FIG. 1(b) were not formed in a bump and dip shape but simply in a flat shape. When the backside of the substrate SSB shown in FIG. 1(c) was irradiated with light, the intensity of the light used for the irradiation was varied at each point of the two-dimensional plane to adjust the amount of decomposition and the shape of the semiconductor at each point of the interface between the light absorption layer BLY and the planarization layer CLY. Then, the substrate SSB was delaminated to thereby process the surface of the planarization layer CLY into a bump and dip shape.

However, by such a fabrication method, the surface of the light extraction face is always formed in a uniform bump and dip shape only with difficulty. It is thus difficult to mass-produce so-called uniform-quality semiconductor light-emitting devices which have a uniform distribution of emission and a stable light extraction efficiency.

In contrast to this, by the fabrication method of this embodiment, the aforementioned multiple microscopic projected portions "a" can be formed on the transfer layer TLY in accordance with a predetermined array, and then the multiple projected portions "a" can be transferred accurately to the surface of the planarization layer CLY. It is thus possible to mass-produce so-called uniform-quality semiconductor light-emitting devices which can provide a desired distribution of emission and a stable light extraction efficiency as well as to accomplish an improved light extraction efficiency.

FIRST EXAMPLE

Now, with reference to FIGS. 2(a) to 5(b), an explanation will be given to a more specific example of the semiconductor light-emitting device 1 shown in FIGS. 1(a)-1(e). In FIGS. 2(a) to 5(b), like reference symbols are used to designate the portions which are the same as or corresponding to those of FIGS. 1(a)-1(e).

The semiconductor light-emitting device 1 of this example looks the same as the one shown in FIG. 1(a), and is fabricated following the fabrication processes shown in FIGS. 2(a) to 5(b).

An explanation will be given to the fabrication process and structure of the semiconductor light-emitting device 1 with reference to FIGS. 2(a) to 5(b). To begin with, the intermediate 100 is fabricated using the sapphire substrate SBB with a {0001} plane employed as the principal plane.

That is, as shown in the perspective view of FIG. 2(a), the underlying layer ALY of gallium nitride (GaN) is laminated by MOCVD or the like on the sapphire substrate SSB, and thereafter, as shown in the perspective view of FIG. 2(b), a mask MSK of $SiO_2$ having a number of microscopic circular opening portions OPN is formed by sputtering on the underlying layer ALY.

Here, as shown in FIGS. 2(d) and 2(e), the aforementioned multiple opening portions OPN are formed such that the translational vectors are arranged to have 6-fold rotational symmetry in parallel to the crystalline axis <1-100> of the underlying layer ALY, allowing the underlying layer ALY to be exposed at each of the circular opening portions OPN.

Then, by MOCVD, GaN is selectively grown on the underlying layer ALY at the opening portions OPN of the mask MSK as well as on the mask MSK in the lateral direction.

As shown in the perspective view of FIG. 2(c), GaN grown in this manner allows the projected portions "a" of a hexagonal pyramid shape made up of a group of GaN {1-101} planes to be formed about each of the circular opening portions OPN.

Further growth of GaN will allow each of the projected portions "a" to grow larger in size while the hexagonal pyramid shape is maintained.

Then, the growth is stopped while the skirts of mutually adjacent projected portions "a" of a hexagonal pyramid shape are in contact with each other. Thus, as shown in FIG. 2(d), the transfer layer TLY has a bump and dip shaped surface which is formed of a number of projected portions "a" of a hexagonal pyramid shape made up of a group of GaN {1-101} planes.

Then, as schematically shown in the longitudinal sectional view of FIG. 3(a), $In_xGa_{1-x}N$ (where x>0.5) is deposited by MOCVD on the aforementioned bump and dip shaped surface of the transfer layer TLY, thereby laminating the light absorption layer BLY of a bump and dip shape which is formed to the aforementioned bump and dip shape.

Furthermore, when irradiated with light of a wavelength of 360 nm or more or preferably with light of the second harmonic of YAG laser (wavelength 532 nm) as discussed later, the light absorption layer BLY is to absorb and convert the light into heat. To this end, the light absorption layer BLY is more preferably doped with an impurity to serve as a non-radiative recombination center, for example, with carbon (C) or iron (Fe).

Then, as shown in the longitudinal sectional view of FIG. 3(b), AlGaN doped with Si is grown by MOCVD on the light absorption layer BLY to form a planarization layer CLY having a flat principal growth plane.

Then, as shown in the longitudinal sectional view of FIG. 3(c), the active layer DLYa of $In_x(Al_yGa_{1-y})_{1-x}N$ (where $0 \leq x \leq 1$ and $0 \leq y \leq 1$), the cladding layer DLYb of AlGaN doped with Mg, and the contact layer DLYc of AlGaN doped with Mg are sequentially laminated by MOCVD on the planarization layer CLY, thereby forming the structured light-emitting layer DLY shown in FIGS. 1(a) to 1(e). That is, the grown layer 4 is formed of each of the layers DLYa, DLYb, and DLYc, and the planarization layer CLY.

Furthermore, the ohmic electrode layer 3b of Pd/Au is formed by vapor deposition on the surface of the contact layer DLYc, thereby fabricating the intermediate 100.

Then, as shown in the cross-sectional view of FIG. 4(a), the electrode layer 3a of the support substrate 2 with the electrode layer 3a of AuSn pre-formed thereon, and the ohmic electrode layer 3b are fused to each other. This allows the intermediate 100 and the support substrate 2 to be integrally securely adhered to each other.

Furthermore, the backside of the sapphire substrate SSB is irradiated toward the light absorption layer BLY with light of a wavelength of 360 nm or greater, more specifically, with light of the second harmonic of YAG laser (wavelength 532 nm).

When irradiated with such light, the sapphire substrate SSB allows the light to pass therethrough. The light further passes through the underlying layer ALY, the mask MSK, and the transfer layer TLY reaching the light absorption layer BLY, where the light absorption layer BLY converts the light into heat and is thus heated and decomposed.

Then, as shown in the cross-sectional view of FIG. 4(b), the sapphire substrate SSB is delaminated, and the underlying layer ALY, the mask MSK, and the transfer layer TLY are delaminated along with the substrate SSB at the gasified portion of the light absorption layer BLY.

Then, as shown in the cross-sectional view of FIG. 5(a), a residue of the light absorption layer BLY which has been left upon delaminating the aforementioned sapphire substrate SSB is removed by wet etching using an alkali etchant, thereby allowing the surface of the planarization layer CLY to be exposed.

This allows a bump and dip shaped surface to be formed on the planarization layer CLY as if the bump and dip shape of the transfer layer TLY and the light absorption layer BLY have been transferred thereto.

That is, a number of microscopic concave portions "c" of an inverted hexagonal pyramid shape made up of a group of AlGaN {1-101} planes are formed on the exposed surface of the planarization layer CLY, thereby providing the planarization layer CLY with a bump and dip shaped surface.

Then, as shown in the cross-sectional view of FIG. 5(b), the electrode layer 5 is laminated on part of the bump and dip shaped surface of the planarization layer CLY. For example, the electrode layer 5 is formed to have the shape of a cross connecting between the opposite corners of the semiconductor light-emitting device, thus completing the same semiconductor light-emitting device 1 as shown in FIG. 1(a).

Here, in order to improve the uniformity of current injection into the grown layer 4, a transparent electrode such as of ITO may be formed as the electrode layer 5 on the entire surface of the planarization layer CLY.

For convenient purposes, the explanation was given to the typical process for fabricating one semiconductor light-emitting device 1. However, practically in the fabrication processes described with reference to FIGS. 2(a) to 5(b), the processing for fabricating a plurality of semiconductor light-emitting devices 1 on the sapphire substrate SSB is performed, and thereafter, the support substrate 2 is scribed on the backside to be divided into a predetermined size, thereby forming a plurality of semiconductor light-emitting devices 1 of a pre-specified size.

Then, a drive current supplied between the electrode layers 3a and 5 causes short-wavelength light to be produced from the active layer DLYa in the grown layer 4, and the light is transmitted out of the device through the surface of a planarization plane CLY of the aforementioned bump and dip shape.

As such, according to the semiconductor light-emitting device 1 of this example having such a structure, the surface of the planarization layer CLY to serve as a light extraction face is not flat but bump and dip shaped with a number of microscopic concave portions "c" of an inverted hexagonal pyramid shape formed thereon. Accordingly, the ratio of the light produced in the active layer DLYa and reflected off the surface back into the light-emitting device can be reduced, thereby providing an improved light extraction efficiency.

Additionally, according to the fabrication method of this example, a number of microscopic projected portions "a" of a hexagonal pyramid shape are formed on the transfer layer TLY in accordance with a predetermined array, and then the multiple projected portions "a" are transferred to the surface of the planarization layer CLY to form a number of microscopic concave portions "c" of an inverted hexagonal pyramid shape on the surface of the planarization layer CLY. It is thus possible to mass-produce so-called uniform-quality semiconductor light-emitting devices which can provide a desired distribution of emission and a stable light extraction efficiency as well as to accomplish an improved light extraction efficiency.

Additionally, the semiconductor light-emitting device 1 of this example is constructed such that the planarization layer CLY to serve as a light extraction face is not formed of p-type nitride semiconductor but is formed of n-type nitride semiconductor having a specific resistance as low as about $10^{-3}$ Ωcm. Thus, this eliminates the need for forming the electrode layer 5 on the entire surface of the planarization layer CLY using a thin metal translucent electrode layer or a transparent electrode such as of ITO. It is thus possible to provide a semiconductor light-emitting device 1 with a good light extraction efficiency.

Additionally, according to the fabrication method of this example, delaminating the aforementioned substrate SSB makes it possible in a collective manner both to remove the underlying layer ALY of gallium nitride (GaN) which absorbs short-wavelength light and to process the surface of the planarization layer CLY into a bump and dip shape. This allows for providing an improved mass productivity.

SECOND EXAMPLE

Figure 6:
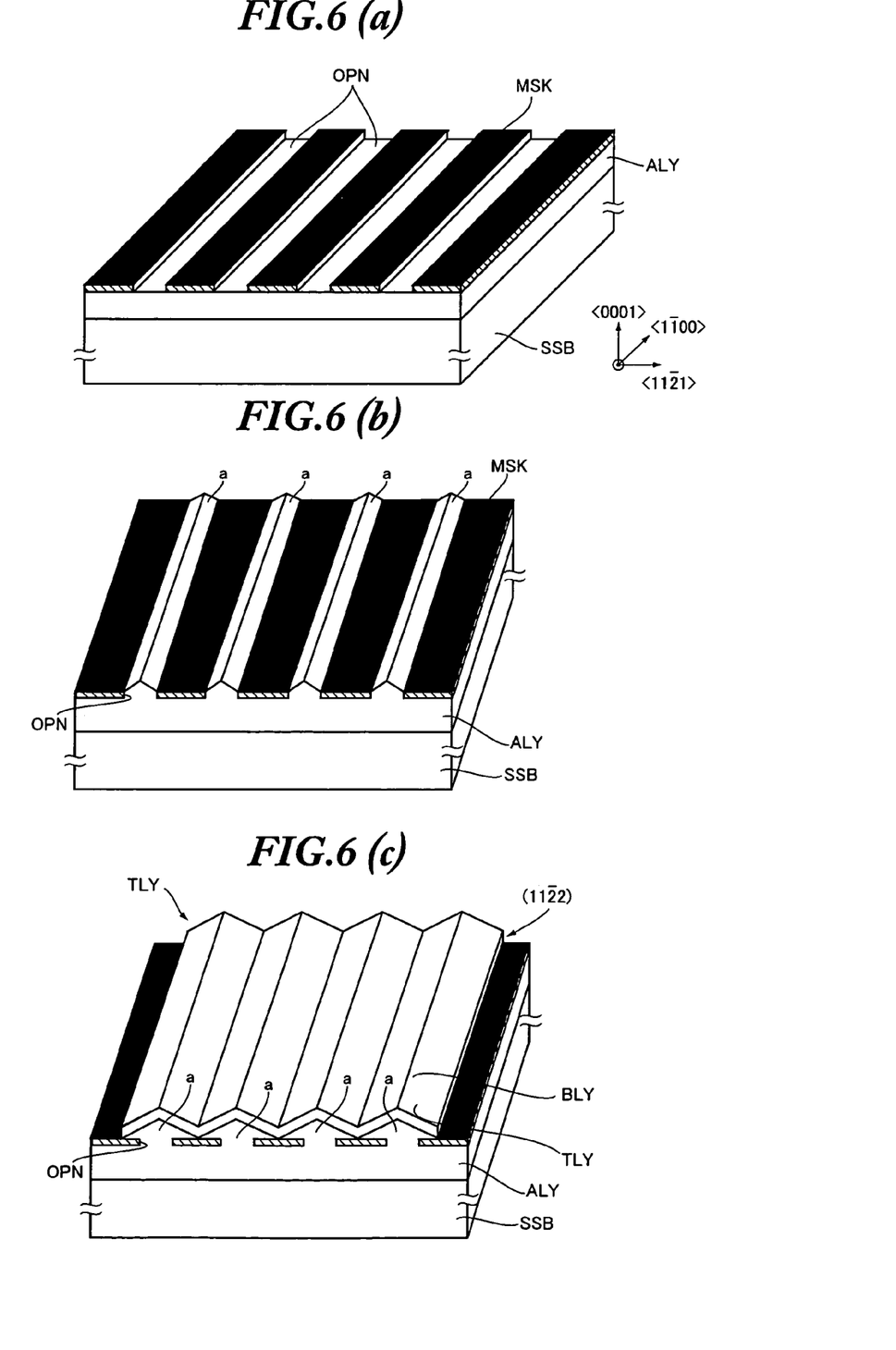
FIGS. 6(a)-6(c) are views showing a fabrication method of a semiconductor light-emitting device according to a second example.

Now, an explanation will be given to another example with reference to FIGS. 6(a)-6(c). In FIGS. 6(a)-6(c), like reference symbols are used to designate the portions which are the same as or corresponding to those of FIGS. 2(a) to 5(b).

As described with reference to FIG. 5(b), in the semiconductor light-emitting device 1 of the first example, a number of microscopic concave portions "c" of an inverted hexagonal pyramid shape are formed on the surface of the planarization layer CLY, thereby providing the planarization layer CLY, employed as a light extraction face, with a bump and dip shaped surface.

In contrast to this, the surface of the planarization layer CLY of this example (the second example) is constructed to have a number of striped microscopic concave portions formed thereon.

Now, an explanation will be given to the fabrication method and the structure of the semiconductor light-emitting device 1 of this example. To begin with, as shown in the perspective view of FIG. 6(a), the underlying layer ALY of gallium nitride (GaN) is formed by MOCVD on the sapphire substrate SSB with a {0001} plane employed as the principal plane, and thereafter, the mask MSK having a number of slit-shaped opening portions OPN which extend in the orientation of GaN <1-100> or GaN <11-20> is formed on the surface of the underlying layer ALY. More specifically, the mask MSK of SiO2 is formed by sputtering.

Then, by MOCVD, gallium nitride (GaN) is selectively grown on the underlying layer ALY at the opening portions OPN of the mask MSK as well as on the mask MSK in the lateral direction.

The gallium nitride (GaN) grown in this manner is to have a {11-22} plane as the GaN growth plane as shown in FIG. 6(b), and thus a number of projected thread portions "a" of a triangular prism shape are formed along the longitudinal direction of each of the opening portions OPN.

Further growth of the GaN will allow the projected thread portions "a" to grow larger in size while the triangular prism state is maintained, and the growth is then stopped while the skirts of the mutually adjacent projected thread portions "a" are in contact with each other.

Thus, as shown in FIG. 6(c), the transfer layer TLY has a bump and dip shaped surface which is formed of the projected thread portions "a" of a triangular prism shape made up of a group of GaN {11-22} planes.

Then, $In_xGa_{1-x}N$ (where x>0.5) is deposited by MOCVD on the surface of the transfer layer TLY, thereby laminating the light absorption layer BLY of a bump and dip shape which is formed in accordance with to the surface shape of the transfer layer TLY. Furthermore, when irradiated with light of the second harmonic of YAG laser (wavelength 532 nm) as discussed later, the light absorption layer BLY is to absorb and convert the light into heat. To this end, the light absorption layer BLY is more preferably doped with an impurity to serve as a non-radiative recombination center, for example, with carbon (C) or iron (Fe).

Then, like the first example described with reference to FIG. 3(b), AlGaN doped with Si is deposited by MOCVD on the light absorption layer BLY to form a planarization layer CLY with a flat surface.

Then, likewise as described with reference to FIG. 3(c), the active layer DLYa of $In_x(Al_yGa_{1-y})_{1-x}N$ (where $0 \leq x \leq 1$ and $0 \leq y \leq 1$), the cladding layer DLYb of AlGaN doped with Mg, and the contact layer DLYc of AlGaN doped with Mg are sequentially laminated by MOCVD on the planarization layer CLY, thereby forming the grown layer 4 made up of each of the layers DLYa, DLYb, and DLYc, and the planarization layer CLY.

Furthermore, the ohmic electrode layer 3b of Pd/Au is formed by vapor deposition on the surface of the contact layer DLYc, thereby fabricating the intermediate 100.

Then, likewise as shown in FIG. 4(a), the electrode layer 3a of the support substrate 2, on which the electrode layer 3a of AuSn is pre-formed, and the ohmic electrode layer 3b are fused to each other. This allows the intermediate 100 and the support substrate 2 to be integrally securely adhered to each other. Then, the backside of the sapphire substrate SSB is irradiated toward the light absorption layer BLY with light of the second harmonic of YAG laser (wavelength 532 nm).

When irradiated with such light, the sapphire substrate SSB allows the light to pass therethrough. The light further passes through the underlying layer ALY, the transfer layer TLY, and the mask MSK reaching the light absorption layer BLY, where the light absorption layer BLY converts the light into heat and is thus heated and decomposed.

Then, likewise as shown in FIG. 4(b), the mask MSK, and the underlying layer ALY and the transfer layer TLY of GaN are delaminated at the gasified portion of the light absorption layer BLY along with the substrate SSB.

Then, likewise as shown in FIG. 5(a), a residue of the light absorption layer BLY which has been left upon delaminating the aforementioned sapphire substrate SSB is removed by wet etching using an alkali etchant, thereby allowing the surface of the planarization layer CLY to be exposed.

Accordingly, the planarization layer CLY is provided on the surface thereof with a number of striped concave portions "c" made up of a group of AlGaN {11-22} planes, and thus with a bump and dip shaped surface. That is, a number of striped concave portions "c" are formed on the surface of the planarization layer CLY corresponding to the multiple projected thread portions "a" formed on the transfer layer TLY, thereby providing the planarization layer CLY with a bump and dip shaped surface.

Then, likewise as shown in FIG. 5(b), the electrode layer 5 is laminated on part of the bump and dip shaped surface (exposed surface) of the planarization layer CLY. For example, the electrode layer 5 is formed to have the shape of a cross connecting between the opposite corners of the semiconductor light-emitting device, thus completing the semiconductor light-emitting device 1 which looks the same as the one shown in FIG. 1(a).

Here, in order to improve the uniformity of current injection into the grown layer 4, a transparent electrode such as of ITO may be formed as the electrode layer 5 on the entire surface of the planarization layer CLY.

For convenient purposes, the explanation was given to the typical process for fabricating one semiconductor light-emitting device 1. However, practically, the processing for fabricating a plurality of semiconductor light-emitting devices 1 on the sapphire substrate SSB is performed, and thereafter, the support substrate 2 is scribed on the backside to be divided into a predetermined size, thereby forming a plurality of semiconductor light-emitting devices 1 of a pre-specified size.

Then, a drive current supplied between the electrode layers 3a and 5 causes short-wavelength light to be produced from the active layer DLYa in the grown layer 4, and the light is transmitted out of the device through the surface of the planarization layer CLY which is bump and dip shaped by a number of striped concave portions "c."

As such, according to the semiconductor light-emitting device 1 of this example having such a structure, the surface of the planarization layer CLY to serve as a light extraction face is not flat but bump and dip shaped with a number of striped concave portions "c" formed thereon. Accordingly, the ratio of the light produced in the active layer DLYa and reflected off the surface back into the light-emitting device is reduced, thereby making it possible to provide an improved light extraction efficiency.

Additionally, according to the fabrication method of this example, a number of projected thread portions "a" of a triangular prism shape are formed on the transfer layer TLY in accordance with a predetermined array, and then the multiple projected thread portions "a" are transferred to the surface of the planarization layer CLY to form a number of striped concave portions "c" on the surface of the planarization layer CLY. It is thus possible to mass-produce so-called uniform-quality semiconductor light-emitting devices which can provide a desired distribution of emission and a stable light extraction efficiency as well as to accomplish an improved light extraction efficiency.

Additionally, the semiconductor light-emitting device 1 of this example is constructed such that the planarization layer CLY to serve as a light extraction face is not formed of p-type nitride semiconductor but is formed of n-type nitride semiconductor having a specific resistance as low as about $10^{-3}$ Ωcm. Thus, this eliminates the need for forming the electrode layer 5 on the entire surface of the planarization layer CLY using a thin metal translucent electrode layer or a transparent electrode such as of ITO. It is thus possible to provide a semiconductor light-emitting device 1 with a good light extraction efficiency.

Additionally, according to the fabrication method of this example, delaminating the aforementioned substrate SSB makes it possible in a collective manner both to remove the underlying layer ALY of gallium nitride (GaN) which absorbs short-wavelength light and to process the surface of the planarization layer CLY into a bump and dip shape. This allows for providing an improved mass productivity.

THIRD EXAMPLE

Figure 7:
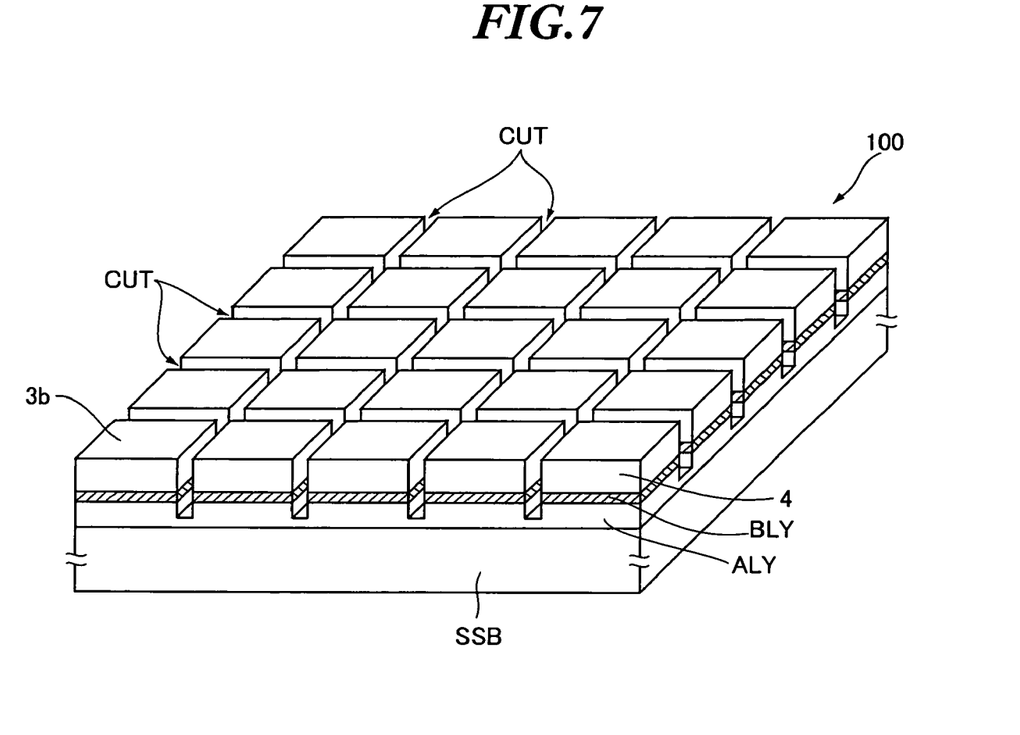
FIG. 7 is a view showing a fabrication method of a semiconductor light-emitting device according to a third example.

Now, an explanation will be given to another example with reference to FIG. 7.

This example relates to a fabrication method for preventing excessive mechanical stress from being exerted on the grown layer 4 having the active layer DLYa, the cladding layer DLYb, and the contact layer DLYc, and the planarization layer CLY, when the sapphire substrate SSB is delaminated as shown in FIGS. 4(a) and 4(b) in the aforementioned first and second examples.

That is, likewise as shown in FIG. 3(c), when the intermediate 100 is fabricated, the grown layer 4 and the ohmic electrode 3b are formed on the light absorption layer BLY. Thereafter, as schematically shown in the perspective view of FIG. 7, by dicing or the like, cut grooves CUT are formed on the ohmic electrode 3b to be deeper than the light absorption layer BLY, thereby providing portions of the same size as that of individual semiconductor light-emitting devices 1.

Then, likewise as shown in FIG. 4(a), an electrode 3a formed on the support substrate 2 and the ohmic electrode 3b of the intermediate 100 having the cut grooves CUT formed thereon are integrally fused to each other. Subsequently, the processing is performed through the processes described with reference to FIGS. 4(a) and 4(b) and FIGS. 5(a) and 5(b), and thereafter, the support substrate 2 is scribed, being aligned with the aforementioned cut grooves CUT, on the backside to be divided into chips of a predetermined size, thereby forming a plurality of semiconductor light-emitting devices 1 of a pre-specified size.

As such, according to the fabrication method of this example, the aforementioned cut grooves CUT are pre-formed on the intermediate 100. Accordingly, when the substrate SSB is delaminated as shown in FIG. 4(b), it is possible to prevent excessive mechanical stress from being exerted on the planarization layer CLY and the grown layer 4, and reduce damage to the grown layer 4.

Furthermore, the grown layer 4 on the substrate SSB is pre-divided by the cut grooves CUT to the size of individual semiconductor light-emitting devices 1. Accordingly, scribing the aforementioned support substrate 2 on the backside allows for very easy division into individual chips of the semiconductor light-emitting device 1, thereby making it possible to provide an improved mass productivity.

In the aforementioned first to third examples, the surface of the planarization layer CLY to serve as a light extraction face is formed into a bump and dip shape having concave portions "c" of an inverted hexagonal pyramid shape, or into a bump and dip shape having striped concave portions "c"; however, the present invention is not always limited to such bump and dip shapes. For example, so-called mesh-shaped or grid-shaped concave portions extending in rows and columns, or so-called mesh-shaped or grid-shaped projected portions extending in rows and columns may be formed on the surface of the planarization layer CLY in place of the aforementioned striped concave portions "c," thereby providing the light extraction face with a bump and dip shape.

Additionally, when a transparent electrode or a translucent electrode layer is formed as the electrode layer 5 on the bump and dip shaped surface of the planarization layer CLY as described above in the first to third examples, these electrode layers may be formed on part of the surface of the planarization layer CLY, but may also be formed on the generally entire surface of the planarization layer CLY.

As such, when the transparent electrode or the translucent electrode layer is formed on the generally entire surface of the planarization layer CLY, light may be absorbed by these electrode layers. However, since the planarization layer CLY is n-type semiconductor having a low specific resistance and these electrode layers can spread current, even a large-size chip can provide uniform emission of light using a single wire bond. Thus, a good light extraction efficiency can be obtained which overcomes the absorption of light by the transparent electrode or the translucent electrode layer.

Additionally, in the aforementioned most preferred embodiment and the first to third examples, the explanations were given to the semiconductor light-emitting devices using nitride semiconductor and the fabrication methods thereof; however, these embodiment and examples are also applicable to semiconductor light-emitting devices using other semiconductor materials and fabrication methods thereof.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. A fabrication method of a semiconductor light-emitting device, comprising:
   a first process for forming an underlying layer on a substrate;

a second process for forming a mask having a number of microscopic opening portions on said underlying layer;

a third process for forming a bump and dip shaped transfer layer having a number of projected portions made up of a plurality of microscopic planes inclined with respect to said substrate plane, by selective growth at each of said opening portions and by lateral growth on said mask;

a fourth process for forming, on said bump and dip shaped transfer layer, a light absorption layer less in band gap energy than said underlying layer and said transfer layer;

a fifth process for forming a planarization layer having a flat principal growth plane on said light absorption layer;

a sixth process for forming a structured light-emitting layer having at least an active layer on said planarization layer; and a seventh process for decomposing said light absorption layer by irradiating the backside of said substrate with light reaching said light absorption layer to delaminate said substrate, the underlying layer, and the transfer layer from said planarization layer, wherein said planarization layer is employed as a light extraction face for extracting light produced in said active layer out of the device, and wherein in said seventh process, an energy level of the light used to irradiate the backside of said substrate is less than a band gap energy level of said underlying layer and said transfer layer and is greater than a band gap energy level of said light absorption layer.

2. The fabrication method of a semiconductor light-emitting device according to claim 1, wherein in said fifth process, said planarization layer is formed of n-type nitride semiconductor, and in said sixth process, said structured light-emitting layer is formed of a multi-layered structure starting with n-type nitride semiconductor from said planarization layer side and ending with p-type nitride semiconductor.

3. The fabrication method of a semiconductor light-emitting device according to claim 1, wherein said underlying layer, said transfer layer, said light absorption layer, said planarization layer, and said structured light-emitting layer are formed of nitride-based III-V compound semiconductor with a group-V element of nitrogen (N).

4. The fabrication method of a semiconductor light-emitting device according to claim 1, wherein said light absorption layer is of InGaN.

5. The fabrication method of a semiconductor light-emitting device according to claim 1, wherein said substrate is formed of any one of sapphire, GaN, AlN, and SiC having a {0001} plane as a principal plane.

6. The fabrication method of a semiconductor light-emitting device according to claim 1, wherein the opening portions of said mask are formed in said second process so that closest opening portions are located in a <1-100> orientation of said underlying layer, and all opening portion centers are a 6-fold rotational symmetry center.

7. The fabrication method of a semiconductor light-emitting device according to claim 1, wherein in said second process, the opening portions of said mask are formed in a striped shape in parallel to a crystalline axis <1-100> or <11-20> of the underlying layer.

8. The fabrication method of a semiconductor light-emitting device according to claim 1, wherein said light absorption layer is of semiconductor containing an impurity to serve as a non-radiative recombination center or of indirect transition type semiconductor.

9. The fabrication method of a semiconductor light-emitting device according to claim 1, wherein in said seventh process, the light used to irradiate the backside of said substrate has a wavelength of 360 nm or more.

10. The fabrication method of a semiconductor light-emitting device according to claim 1, further comprising a process for securely adhering the surface of said structured light-emitting layer to the support member, the process being provided between said sixth process and said seventh process.

11. The fabrication method of a semiconductor light-emitting device according to claim 1, further comprising a process for forming a cut groove on said structured light-emitting layer to provide semiconductor light-emitting devices of individually divided sizes, the process being provided between said sixth process and said seventh process.

* * * * *